United States Patent
Dobson

(10) Patent No.: US 6,423,635 B1
(45) Date of Patent: Jul. 23, 2002

(54) METHOD OF FILLING A RECESS

(75) Inventor: Christopher David Dobson, Bristol (GB)

(73) Assignee: Trikon Equipments Limited, Gwent (GB)

( * ) Notice: Subject to any disclaimer, the term of this patent is extended or adjusted under 35 U.S.C. 154(b) by 0 days.

(21) Appl. No.: 09/462,465

(22) PCT Filed: Jul. 8, 1998

(86) PCT No.: PCT/GB98/02003

§ 371 (c)(1),
(2), (4) Date: Mar. 17, 2000

(87) PCT Pub. No.: WO99/03150

PCT Pub. Date: Jan. 21, 1999

(51) Int. Cl.[7] .............................................. H01L 21/44
(52) U.S. Cl. ....................... 438/676; 438/597; 438/627; 438/661; 438/687; 438/688
(58) Field of Search .................... 438/597, 627, 438/661, 676, 687, 688

(56) References Cited

U.S. PATENT DOCUMENTS

| 4,800,179 A | * | 1/1989 | Mukai | 438/632 |
|---|---|---|---|---|
| 5,032,233 A | * | 7/1991 | Yu et al. | 438/662 |
| 5,434,107 A | * | 7/1995 | Paranjpe | 438/760 |
| 5,527,561 A | * | 6/1996 | Dobson | 427/383.3 |
| 5,985,763 A | * | 11/1999 | Hong et al. | 438/688 |
| 6,093,654 A | * | 7/2000 | Koyama | 438/715 |
| 6,174,806 B1 | * | 1/2001 | Thakur et al. | 438/653 |
| 6,184,131 B1 | * | 2/2001 | Sugai | 438/660 |

FOREIGN PATENT DOCUMENTS

| EP | 0 251 523 | | 1/1998 |
|---|---|---|---|
| GB | 2 247 781 | | 3/1998 |
| WO | WO-95/22170 | * | 8/1995 |

* cited by examiner

Primary Examiner—Keith Christianson
Assistant Examiner—Asok Kumar Sarkar
(74) Attorney, Agent, or Firm—Volentine Francos, PLLC

(57) ABSTRACT

The invention relates to a process for filling a multiplicity of recesses (3) formed in an exposed surface of a workpiece (1), wherein the mouths of the recesses (3) are closed by the deposition of a layer (10) and the layer is subjected to elevated temperature and pressure to force material from the layer down into the recesses. In the particular embodiments described, the elevated temperature is achieved by supplying very short thermal pulses, for example, from a light source such as a laser or a halogen light and preferably this thermal pulse is applied after the elevated pressure has been achieved.

18 Claims, 4 Drawing Sheets

METHOD OF FILLING A RECESS

The present invention relates to a method of processing a workpiece and in particular, but not exclusively, to processing a semiconductor wafer.

In our European Patent Application No. 92306433.8 (0516344) we described a method of processing a workpiece having a multiplicity of recesses formed in an exposed surface, the method comprising depositing a first layer of material on the exposed surface until the first layer extends over all the recesses to close completely the openings of all the recesses in the exposed surface and subjecting the wafer and the first layer to elevated pressure and an elevated temperature sufficient to cause parts of the first layer to deform, without melting, to fill the respective recesses. This method is particularly suitable for forming interconnects in semi-conductor wafers and is most conveniently performed at elevated temperatures which are significantly below melting point, but which are yet high enough to reduce the yield strength of the first layer material to allow deformation at attainable pressures.

This method works well with aluminium and aluminium alloys, but it obviously impacts on the thermal budget available during the processing of the semi-conductor wafer. One of the effects of exceeding the thermal budget is to increase the risk of penetration of the silicon surface protecting barrier layer, by the interconnect material. This phenomenon, known as spiking, destroys the delicate active silicon region. GB-A-2247781 describes attempts to use laser heating to achieve reflow of metallised layers. It reveals significant energy window constraints due to optical ablation; the need for significant substrate heating and a requirement for anti-reflective coatings of refractory materials.

WO-A-95/22170 describes apparatus for providing a pressure pulse which may be accompanied by a pulse of thermal energy using a heating coil which heats the whole wafer.

These thermal budget considerations become even more significant as manufacturers move towards using copper as the interconnect material. The melting point of copper is much higher and its appropriate temperature at which the yield strength is suitable at attainable pressures is correspondingly higher.

The present invention consists in a method of processing a workpiece having a multiplicity of recesses formed in an exposed surface, the method comprising depositing a first layer of material on the exposed surface until the first layer extends over all the recesses to close completely the openings of all the recesses in the exposed surface and subjecting the wafer and the first layer to elevated pressure and elevated temperature sufficient to cause parts of the first layer to deform, without melting, to fill respective recesses characterised in that the heat is supplied in a thermal pulse within or to the first layer and the pressure is supplied during or throughout the thermal pulse.

Preferably the elevated pressure, which typically may be between 40–1000 bar (typically 700–750 bar) completely overlaps with the thermal pulse, indeed conveniently the elevated pressure is reached prior to the application of the thermal pulse, because of the difficulties which may occur with rapid pulsing of the pressure. The thermal pulse may be applied to the exposed surface region by region causing progressive filling of the recesses. For example it may be scanned over the surface using a raster scan or other scan protocol.

The thermal pulse may be applied using electro-magnetic radiation. Preferably this radiation is light and the light may be supplied from a coherent or incoherent sources, e.g. a laser, Xenon or Halogen source. The pulse may last up to 1 microsecond in length and a pulse length of the order of 100 nanoseconds is convenient. When a laser or concentrated light source is used consideration needs to be given to optical ablation. However, by using the laser or the like in a high pressure environment, the Applicant is able to broaden significantly the usuable energy window, as ablation will not occur until higher temperatures.

The energy of the pulse may be between 0.5 and 10 Joules per $cm^2$ when the pulse length is of the order of 10's or 100's of nanoseconds, because a significant power will then result. A pulse of 1 joule per cm for 100 nanoseconds, for example, should produce sufficient power to heat a copper layer of $\mu$m's thickness. A man skilled in the art can identify the proper combination of energy and time parameters for any particular layer without undue experimentation.

Where the thermal pulse is supplied by radiation, the method may further comprise coating the exposed surface with a coating, which is absorbent at the radiation wavelength or wavelengths.

Thus when a layer is aluminum or aluminium alloy, an anti-reflective coating may be applied prior to the application of the radiation. A particular advantage of the Applicants' process, vis-a-vis aluminium, is that the lower heat requirements should enable TiN to be used as an anti-reflective coating. As this is a preferred harrier layer material, this significantly simplifies apparatus requirements. In the case of copper, because it is inherently absorbent in the green, it should usually be possible to select a light source with an appropriate wave length or range of wave lengths.

Heating of the silicon substrate can be used to reduce the power requirements of the thermal pulse source, but often this will be undesirable, because some of the thermal budget advantages will be lost. In any case it will normally be desired to keep the substrate temperature significantly below 400° C. and temperatures below around 350° C. are desirable because heat induced damage to dielectric layers particularly low K dielectric layers at these temperatures is significantly at the temperatures.

Another particular advantage of keeping the substrate at as near room temperature as possible is that as the layer deforms to fill the recesses it comes into contact with barrier layers that are significantly cooler than the layer as it collapses. The barrier layer is therefore less likely to be spiked. Quenching of the layer as it contacts the significantly cooler under layers may also take place.

Although the invention has been defined above it is to be understood it includes any inventive combination of the features set out above or in the following description.

The invention may be performed in various ways and a specific embodiment will now be described by way of example with reference to the accompanying drawings, in which.

Figure 1:
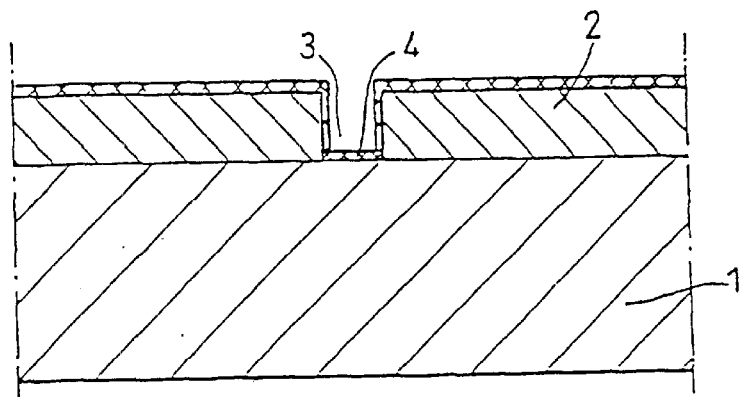
FIG. 1 shows a cross section of a semi-conductor wafer prior to the formation of a layer.

FIG. 1 shows the semiconductor wafer 1 with an etched pre-existing layer, such as an oxide layer 2 thereon and a thin layer of barrier material or some such contact improver or promotor or seed layer 4. The layer 2 has a hole or trench structure 3 therein, and the present invention is concerned with the problem of filling the hole or trench structure 3 with another material. Typically this will be an electrically conducting material so that an electrical contact can be-made with an active region in the wafer 1 via a barrier layer 4.

Figure 2:
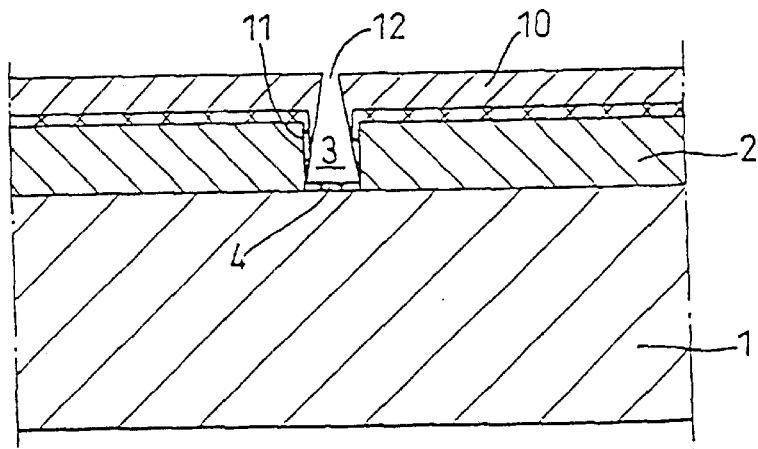
FIG. 2 shows a cross section of the wafer of FIG. 1, at an intermediate stage in the formation of a layer.

FIG. 2 illustrates the formation of a metal layer 10, for example, by sputtering, but this and other materials may be deposited in appropriate manners. For example, an insulating layer might be deposited by chemical vapour deposition or spin on techniques. Metals may be deposited by wet plating techniques, ion plating, evaporation, chemical vapour deposition or any appropriate technique.

Figure 3:
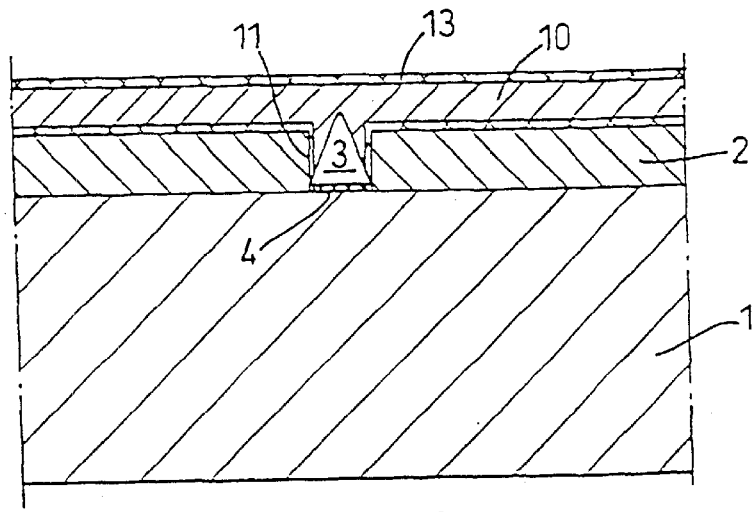
FIG. 3 shows a cross sectional view of the wafer, after the layer has been completed.
Figure 4:
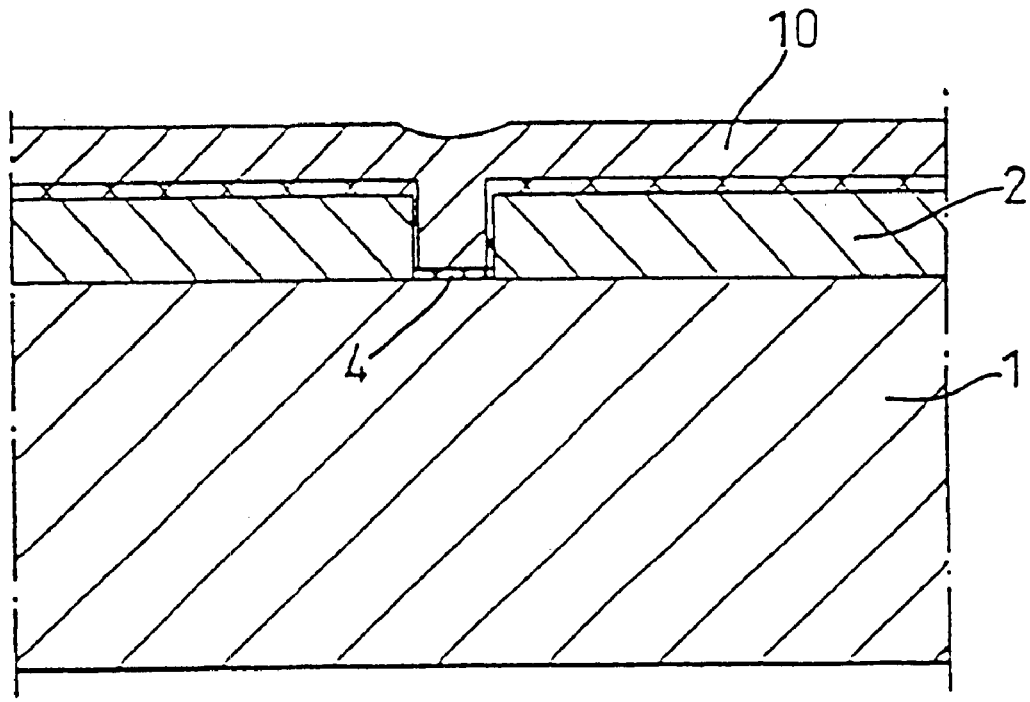
FIG. 4 shows a cross sectional view of the wafer, after exposure to elevated pressure and elevated temperature.

The process of deposition continues until the new layer is sufficiently thick to have closed the mouth of each and every structure 3 as indicated in FIG. 3. Contact may or may not have been made with the side walls 11. Once the FIG. 3 situation has been achieved, the deposition of material ceases. The wafer and its layers are then subjected to elevated temperature and pressure to achieve the deformation of the layer 10 down into the structure 3 until the structure 3 is filled as shown in FIG. 4.

In general principle this is what is described in the above mentioned European Patent Application, which is incorporated by reference.

In the present invention, the heat is advantageously applied to the layer 10 using a very short thermal pulse (e.g. of the order of 40 to 250 nanoseconds). The length of the thermal pulse, and the energy supplied by it, are determined by the need to heat the layer sufficiently to alter the yield strength of the material so that the pressure can deform the material into the hole 3, without heat being transmitted from the layer 10, down through the oxide layer 2, into the wafer 1. The deformation process also can take place in a period of the order of tens of nanoseconds and so with appropriate adjustment it is possible to heat only during the period of deformation with the result that by the time the material reaches the bottom of the structure 3 it should have already cooled significantly thus reducing the likelihood of barrier penetration. Additionally or alternatively the spiking may be reduced by the relative coolness of the substrate as mentioned previously. These figures are based on sub-micron structures 3 being filled. For larger structures, such as trenches the filling time is likely to be increased.

For copper and aluminum it is believed that energy densities of the order of one Joule per $cm^2$ can be used because the extremely short pulse length means that the power density per $cm^2$ is extremely high (eg. 100 MW/$cm^2$).

Figure 6:
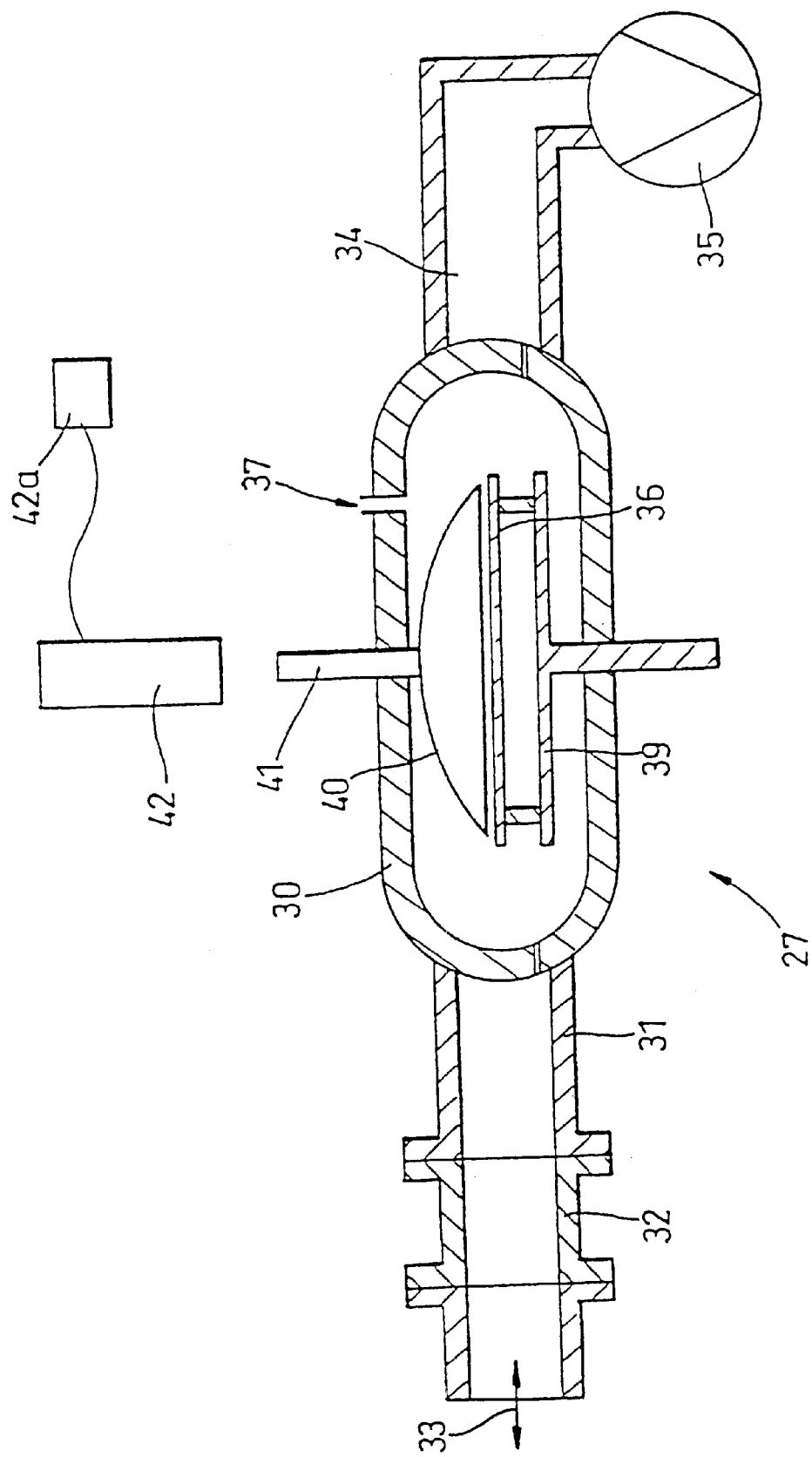

The pulse may be supplied using a focus flash lamp or a pulsed laser source. Other radiative sources may also be suitable. Depending, for example, on the size of the wafer to be processed it may be necessary to scan the source region-by-region. Alternatively an optical system may be needed to diffuse the laser to achieve uniform power distribution. This is shown in FIG. 6 where from a radiation light source 42 driven by a power supply 42a is connected by a light pipe 41 to a light distribution lens 40.

A coating 13 may be provided prior to the application of the thermal pulse to increase the absorption of the pulse. For example, on aluminium this may be an anti-reflective coating, such as TiN. Copper is naturally absorbent in the green and so, with a suitable power source or wavelength adjustment, the need for such a coating could be avoided.

As has been mentioned above substrate heating can reduce the energy required for thermal pulse, but this would reduce the thermal budget and cold barrier layers advantages of the system described.

Figure 5:
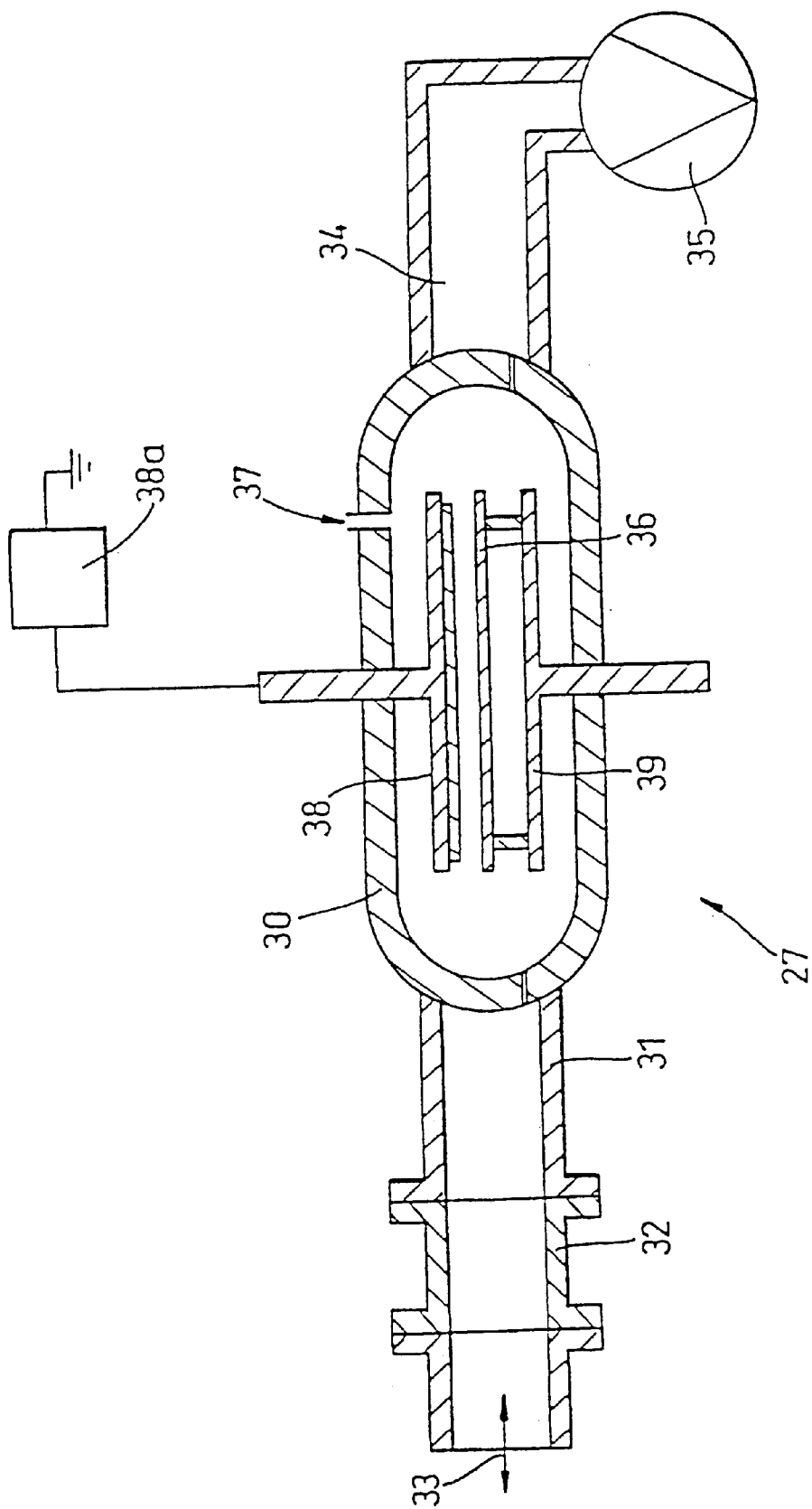
FIGS. 5 and 6 are schematic sectional views of apparatus for subjecting the wafer to an elevated pressure and temperature.

Apparatus for applying significant pressures to wafers is generally described in our European Patent Application No. 923046338 (0516344), which is incorporated by reference, but a suitable arrangement is illustrated schematically at 27 in FIG. 5. Thus a pressure vessel 30 is connected, via a passageway 31, containing a gate valve 32, to a wafer supply region not shown. Wafers may be introduced into, and removed from, the pressure vessel 30 via the passageway 31 by opening and closing of the gate valve 32. This movement being shown by arrow 33. The interior of the pressure vessel 30 communicates via a gate valve 43 with a vacuum chamber 34 connected to a pump 35. This enables the interior of the pressure vessel 30 to be evacuated for the wafer exchange.

A platten 36 is provided for supporting a wafer which has been introduced into the pressure vessel 30. An inlet 37 is connected to the vessel 30 so that high pressure Argon can fill the interior of the vessel 30 subjecting the wafer and the layers to suitably controlled pressures. A radiative source 38 is schematically shown and could be a coherent or incoherent light source e.g. laser, Halogen or Xenon source as previously described. In use, the wafer will be introduced into the chamber 30, the chamber will then be pressurised and the thermal pulse applied using the source 38 and power supply 38a. A background heating plate 39 may be provided. However, in general this will be omitted, because one of the advantages of the system is that it will often remove the need for internal heaters and thermocouples in a high pressure region. In some instances in may be desirable to have the substrate above room temperature, because, for any particular process, there is a comprise between pressure and temperature. Often wafers will carry some heat from their previous processing, but on occasions it may be desirable to provide some substrate heating. This heating should only result in substrate temperatures substantially below 400° C. and a maximum of around 350° C. would normally be desirable.

It will also be appreciated that the use of thermal pulses enables a single machine to form aluminium and copper interconnecting layers.

As an alternative to heating via radiation, an electric current pulse could be fed through the layer 10, when it is electrically conductive, by means of applied contacts.

What is claimed is:

1. A method of processing a workpiece having a multiplicity of recesses formed in an exposed surface, the method comprising depositing a first layer of material on the exposed surface until the first layer extends over all the recess to close completely the openings of all the recesses in the exposed surface and subjecting the wafer and the first layer to elevated pressure and heat sufficient to cause parts of the first layer to deform, without melting, to fill the respective recesses, wherein the heat is supplied by transmitting a pulse of electromagnetic radiation to the first layer such that the pulse of electromagnetic radiation is transformed into a thermal pulse within the first layer, and wherein the pressure is applied during or throughout the thermal pulse.

2. A method as claimed in claim 1 wherein the elevated pressure completely overlaps with the thermal pulse.

3. A method as claimed in claim 1 wherein the thermal pulse is applied to the exposed surface region by region causing progressive filling of the recesses.

4. A method as claimed in claim 1 wherein the radiation is light.

5. A method as claimed in claim 4 wherein the light is supplied from a laser, Xenon or Halogen source.

6. A method as claimed in claim 1 wherein the thermal pulse is applied by resistive heating.

7. A method as claimed in claim 1 wherein the pulse is up to 1 microsecond in length.

8. A method as claimed in claim 7 wherein the pulse length is less than 300 nanoseconds.

9. A method as claimed in claim 7 wherein the energy of the pulse is between 0.5 and 10 joules/cm$^2$.

10. A method as claimed in claim 9 wherein the energy of the pulse is less than 3 joule/cm$^2$.

11. A method as claimed in claim 1 including coating the exposed surface with a coating which is absorbent at radiation wavelength or wavelengths.

12. A method as claimed in claim 11 wherein the coating is TiN.

13. A method as claimed in claim 1 wherein the substrate temperature is below around 350°.

14. A method as claimed in claim 1 wherein the substrate temperature is substantially below 400° C.

15. A method as claimed in claim 1 wherein the substrate is not separately heated.

16. A method as claimed in claim 1 wherein the first layer is aluminium, aluminium alloy or copper or copper alloy.

17. A method as claimed in claim 1 wherein the thermal pulse is applied to the first layer region by region.

18. A method as claimed in claim 1 wherein the heat within the first layer is dissipated prior to reaching the substrate.

* * * * *